United States Patent [19]

Harward

[11] Patent Number: 5,469,078

[45] Date of Patent: Nov. 21, 1995

[54] PROGRAMMABLE LOGIC DEVICE ROUTING ARCHITECTURE

[75] Inventor: Mark G. Harward, Dallas, Tex.

[73] Assignee: Texas Instruments Incorporated, Dallas, Tex.

[21] Appl. No.: 177,891

[22] Filed: Jan. 6, 1994

[51] Int. Cl.[6] .................................................. H03K 19/177
[52] U.S. Cl. ............................... 326/41; 326/21; 326/101
[58] Field of Search ................................. 307/465, 202.1, 307/465.1, 443; 326/39, 41, 21, 47, 101; 327/525

[56] References Cited

U.S. PATENT DOCUMENTS

| | | | |
|---|---|---|---|
| 4,433,331 | 2/1984 | Kollaritsch | 340/825.83 |
| 4,642,487 | 2/1987 | Carter | 307/465 |
| 4,758,745 | 7/1988 | Elgamal et al. | 307/465 |
| 4,870,302 | 9/1989 | Freeman | 307/465 |
| 5,073,729 | 12/1991 | Greene et al. | 307/465.1 |
| 5,122,685 | 6/1992 | Chan et al. | 307/465.1 |
| 5,191,241 | 3/1993 | McCollum et al. | 307/465 |
| 5,341,040 | 8/1994 | Garverick et al. | 307/465 |

*Primary Examiner*—David R. Hudspeth
*Assistant Examiner*—Jon Santamauro
*Attorney, Agent, or Firm*—John D. Crane; Richard L. Donaldson

[57] ABSTRACT

An integrated electronic circuit architecture has low leakage current and capacitance and includes a user-programmable integrated circuit design (110) having a plurality of designed conductors (112, 118) and a plurality of designed functional circuit blocks (e.g., 12,14, etc.). In the architecture, a plurality of user-programmable antifuse elements (e.g., 26, 28, 30, etc.) connect to the plurality of conductors (112, 118) and the plurality of functional circuit blocks (12, 14, 16, etc.). The plurality of user-programmable antifuse elements (e.g., 26, 28, 30, etc.) connect the plurality of conductors (112, 118) with one another and to the plurality of functional circuit blocks (12, 14, 16, etc.). The plurality of conductors (112, 118) is segregated into at least two groups including a first group of conductors and a second group of conductors. Antifuses (26, 28, 32) in the first group of conductors are selectively depopulated to reduce capacitance and leakage associated with their placement in the user-programmable integrated circuit (110), while the conductors of the first group of conductors permit access to conductors in the second group of conductors. Segmentation transistors (114, 122, 136) separate the first group of conductors from the second group of conductors.

9 Claims, 5 Drawing Sheets

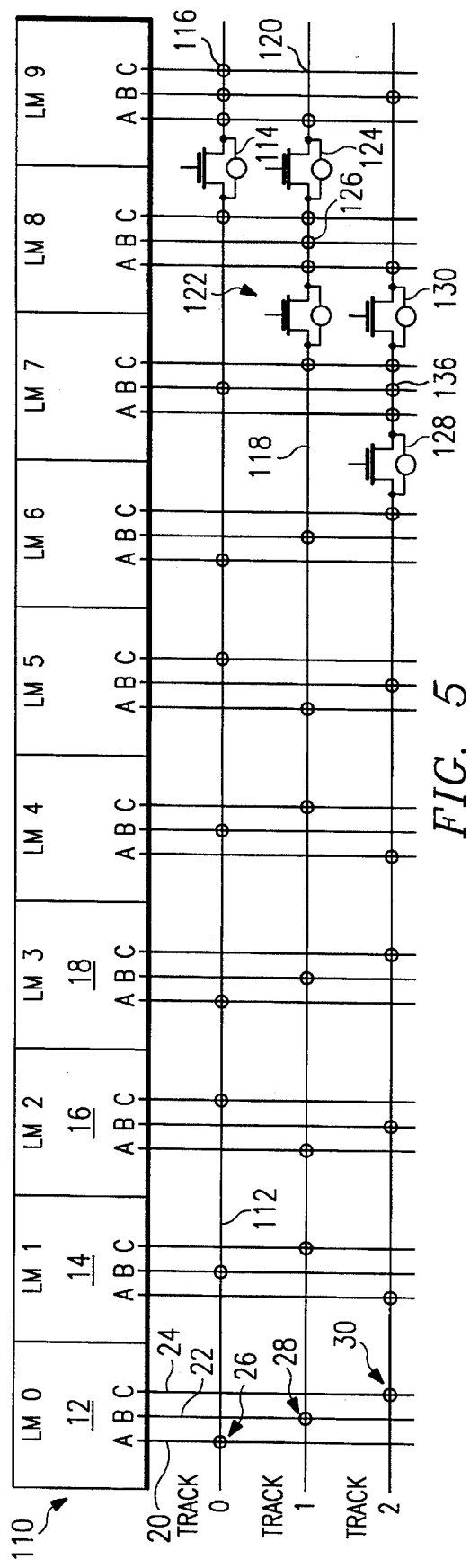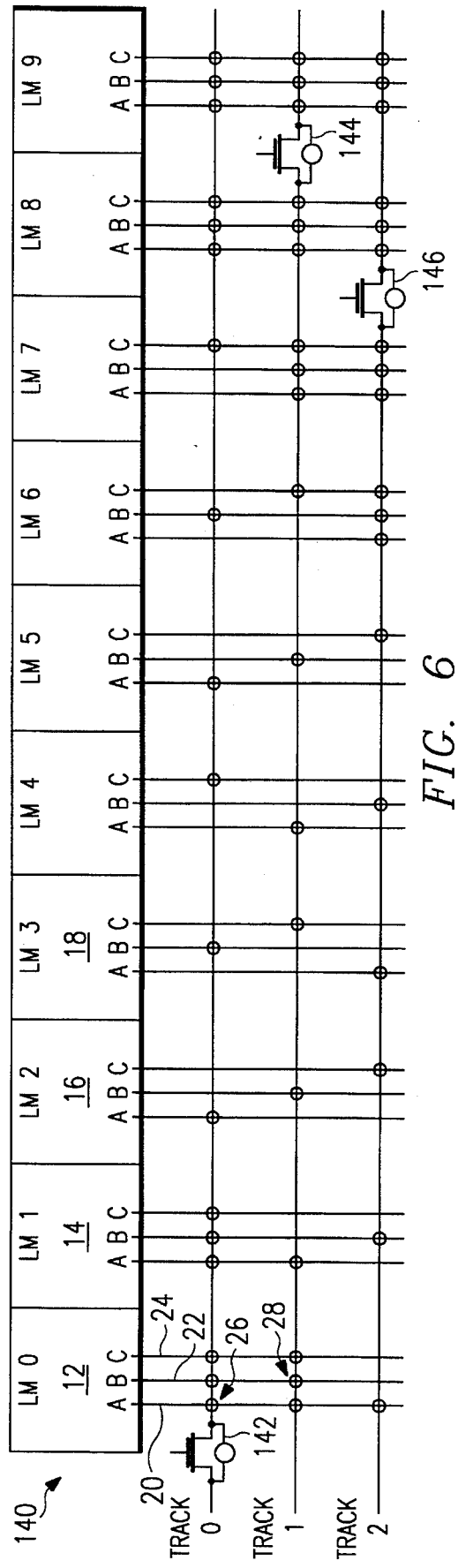
FIG. 5
FIG. 6

PROGRAMMABLE LOGIC DEVICE ROUTING ARCHITECTURE

TECHNICAL FIELD OF THE INVENTION

The present invention generally relates to integrated circuit technology and, more particularly, to a routing architecture for integrated circuits such as field programmable gate arrays, programmable logic devices, and the like.

BACKGROUND OF THE INVENTION

Integrated electronic circuits are usually fabricated with all internal connections set during the manufacturing process. However, because of the high circuit design and development costs, as well as high tooling costs for making such circuits, a new type of integrated circuits is appearing in the integrated circuit marketplace. These circuits are called user-programmable circuits because a user may program them using a series of programmable links within the circuit. Programmable links are electrical interconnects that the user breaks or makes at selected electronic nodes in the fully fabricated and packaged integrated circuit device. These interconnects occur by programming which activates or deactivates the selected electronic nodes to make the integrated circuit perform the desired functions or set of functions that the user desires.

One type of programmable link, the antifuse link, creates a short or relatively low resistance (e.g., less than 1 KΩ) link between two or more connectors. Antifuse links, or simply antifuses, consist typically of two conductor or semiconductor elements having some kind of dielectric or insulating material between them. During programming, the dielectric at selected points between the conductive elements breaks down due to a current that develops from applying a pre-determined programming voltage to the conductive elements of selected antifuses. This electrically connects the conducting or semiconducting elements.

Undesirable capacitances and leakage currents of unused antifuses are problems that occur in user-programmable integrated circuits that use antifuses. That is, the antifuse, which is normally an open device in its unprogrammed condition, has an associated leakage current between the connectors and produces some degree of capacitance between the connectors. Some antifuses have different characteristics in their non-programmed state. For example, some have lower capacitance (e.g., in the 1 pF range) and others have larger capacitances (e.g., in the 8 pF range). Some antifuses, on the other hand, have lower leakage current levels than others (e.g., less than 1 nA verses 30 nA). They all, however, have leakage currents and capacitances that adversely affect the operation of the user-programmable integrated electronic circuits that use them.

SUMMARY OF THE INVENTION

There is a need, therefore, for an improved routing architecture for user-programmable integrated electronic circuits which use antifuses in order to overcome the capacitance and leakage current problems existing in known routing architectures.

The present invention, accordingly, provides an improved routing architecture for programmable logic devices such as field programmable gate arrays (FPGAs) that overcomes or reduces disadvantages and limitations associated with prior integrated electronic circuit routing architectures.

One aspect of the invention is an integrated electronic circuit architecture that has low leakage current and capacitance and that includes a user-programmable integrated circuit design having a plurality of designed conductors and a plurality of designed functional circuit blocks. In the architecture, a plurality of user-programmable antifuse elements connect to the plurality of conductors and the plurality of functional circuit blocks. The plurality of user-programmable antifuses connect the plurality of conductors with one another and to the plurality of functional circuit blocks. The plurality of conductors is segregated into at least two groups including a first group of conductors and a second group of conductors. The first group of conductors has a greater length than the second group of conductors and conductors of the first group connect to conductors in the second group of conductors. Antifuses in the first group of conductors are selectively depopulated to reduce capacitance and leakage associated with their placement in the user-programmable integrated circuit, while the conductors of the first group of conductors permit access to conductors in the second group of conductors.

A technical advantage of the present invention is that it reduces the number of antifuses on segments of various lengths in a way that is optimal for the particular gate density of the integrated electronic circuit. Integrated electronic circuits with antifuses use the concepts of the present invention experience reduced signal propagation delays, and reduced peak and average CMOS currents. This is due to the fact that current, i, has the relationship: $i = fcv$ where, $i$=current; $f$=frequency; $c$=capacitance, and $v$=voltage, reduce quiescent leakage currents on antifuses that have DC voltages across them.

Another technical advantage of the present invention is that it provides reduced leakage and reduced net capacitance without increasing the costs of either the associated integrated circuit or the integrated circuit design.

Yet another technical advantage of the present invention is that through the use of segmentation antifuses the present invention isolates long sparsely populated tracks from short densely populated tracks. This permits optimal isolation of the capacitance and leakage characteristics of the densely populated tracks when the densely populated tracks are not needed for the particular programmed application of the user-programmable integrated circuit.

Still another technical advantage of the present invention is that it permits application of its inventive concepts in user-programmable integrated circuits that have tracks that run in both an X-direction and a Y-direction.

BRIEF DESCRIPTION OF THE DRAWINGS

The invention and its modes of use and advantages are best understood by reference to the following description of illustrative embodiments when read in conjunction with the accompanying drawings, wherein:

FIG. 5 provides a schematic illustration of a circuit that distributes antifuses with sparsely populated segments;

FIG. 6 illustrates the concept of variable depopulation within an individual segment according to the various embodiments;

DETAILED DESCRIPTION OF ILLUSTRATIVE EMBODIMENTS

The illustrative embodiments of the present invention are best understood by referring to the FIGUREs, wherein like numerals are used for like and corresponding parts of the various drawings.

Figure 1:
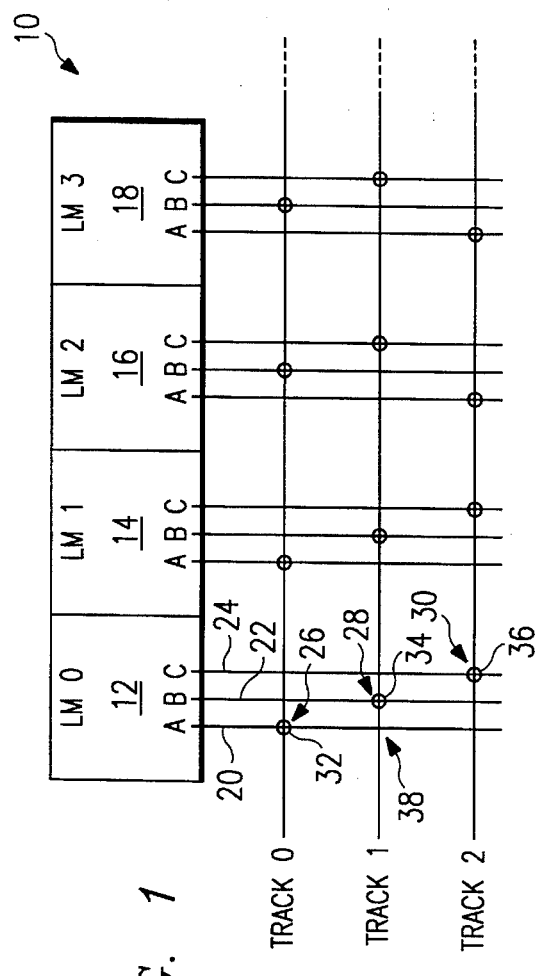
FIG. 1 illustrates a possible implementation of certain concepts of the present invention.

FIG. 1 shows user-programmable integrated electronic circuit 10 that includes, for example, logic module 0 (LM0) at reference number 12, LM1 at 14, LM2 at 16, and LM3 at 18. Connecting to each of LM0 through LM3 are conductors in the form of input pins such as input pins A, B, and C at respective reference numerals 20, 22, and 24 that may connect to other conductors in the form of tracks such as track 0 at reference numeral 26, track 1 at 28 and track 2 at 30. Antifuses may be in the integrated circuit such as antifuse 32 for connecting track 0 to input pin A, antifuse 34 for connecting track 1 to input pin B, and antifuse 36 for connecting track 2 to input pin C. Thus, as integrated circuit 10 illustrates, although there could be a connection such as at the intersection 38 of pin A with track 1, an antifuse does not appear. As such, a connection between input pin A and track 1 cannot occur in this configuration. Instead, antifuse 34 connects track 1 to input pin B as the only antifuse link.

An inventive concept of the present embodiment is a methodology for reducing the number of antifuses on segments of various lengths. One using the present embodiment may, therefore, remove antifuses from the segment according to the length of the segment or according to the amount that is optimal for the particular gate density of the device. For example, the gate density of a field programmable gate array (FPGA) an optimal gate density may be selected. On the other hand, there may be additional ways to optimally depopulate the antifuses.

When determining the optimum antifuse depopulation scheme, it is helpful to consider the macro library that the end user will possess for the full fabricated and packaged integrated circuit. It is important, however, that the segment be adequately populated to service the most common macros. One way to determine the optimal antifuse depopulation is to examine, for all macros in the library, those potential antifuse locations for which there is no need to connect a track to an input pin. By not placing an antifuse at such a location, the present embodiment avoids the unnecessary capacitance and leakage that the unused antifuse would produce.

The present embodiment takes advantage of the observation that antifuses may be reduced from a long track with a minimal loss of flexibility as compared to removing a similar number of antifuse interconnects from a short track. Therefore, removing antifuses from a long track will reasonably maintain the flexibility of the long track and, therefore, the flexibility of the integrated circuit using the antifuses.

In defining a long segment versus a short segment, it is possible to distinguish based on the leakage and capacitance that the antifuses contribute to the total leakage and total capacitance of the segment.

User-programmable integrated circuit 10 of FIG. 1 possesses attractive connection capabilities coupled with a generally lower leakage current and reduced capacitance in comparison to known user-programmable circuits having equivalent logic module and conductor configurations. According to the present embodiment, the architecture for designing user-programmable integrated circuit 10 is to segregate the circuit layout of conductors such as track 0, track 1, and track 2 into at least two groups of conductors. The first group has a sufficiently large number of antifuse elements so that the antifuse elements contribute a larger proportion to the total current leakage and capacitance of the group than do the antifuses associated with the second group contribute to the total leakage current and capacitance of the second group. With these distinctions, the present architecture contemplates depopulating selected ones of the antifuse elements from the first group. The selected antifuses are selected to minimally reduce the programmability of the user-programmable integrated circuit while optimally reducing the total leakage and capacitance of the first group.

The following example illustrates one way to calculate the capacitance and leakage current of a user-programmable integrated circuit having anti-fuses. These calculations make it possible to group segments into groups for which selective depopulation will reduce leakage currents and capacitances significantly. This type of distinction makes possible to calculate the total leakage current and capacitance reduction that selective depopulation may achieve.

The calculations proceed from an analysis of the capacitance of a segment and its associated leakage current. The segment capacitance may be calculated using the following formula:

$$\text{Segment capacitance} = [C_{metal} \cdot Length] + [C_{antifuse} \cdot Number_{antifuses}] + C_{junction} \quad (1)$$

An example using specific parameter values assists in understanding the concepts of distinguishing among groups of conductors for which to depopulate the anti-fuses. With the following parameter values:

$C_{metal}$=0.3 fF/µm,

Length=200 µm (per logic module width or height), $C_{antifuse}$=5 fF/antifuse $Number_{antifuses}$=16 (per logic module), and $C_{junction}$=100 fF (including segmentation and programming transistors), the capacitance calculation gives the following value:

Segment capacitance =
(0.3 fF/µm · 200 µm) + (5 fF) · (16 antifuses) +
100 fF = 240 fF In general, the capacitance for various depopulation configurations may be the following.

$$C_{total} = \text{total circuit capacitance} = (\text{other} + C_{antifuse}) \quad (2)$$

$$C_{full} = \text{circuit capacitance with fully populated antifuses} = \frac{(100 + 60 \text{ fF/logic module width}) +}{80 \text{ fF/logic module width}} \quad (3)$$

$$C_{half} = \begin{array}{c}\text{circuit capacitance}\\ \text{with antifuses}\\ \text{populated to one-half}\\ \text{of the fully populated}\\ \text{level}\end{array} = \begin{array}{c}(100 + 60 \text{ fF/logic}\\ \text{module width}) +\\ 40 \text{ fF/logic}\\ \text{module width}\end{array} \quad (4)$$

$$C_{quarter} = \begin{array}{c}\text{circuit capacitance}\\ \text{with antifuses}\\ \text{populated to only}\\ \text{one-quarter of the}\\ \text{fully populated level}\end{array} = \begin{array}{c}(100 + 60 \text{ fF/logic}\\ \text{module width}) +\\ 20 \text{ fF/logic}\\ \text{module width}\end{array} \quad (5)$$

Table 1, below, provides sample tabulations for the capacitance associated with various length tracks.

TABLE 1

| Track Segment Length | $C_{full}$ (fF) | $C_{half}$ (fF) | $C_{quarter}$ (fF) | Cap Reduction From 50% Depop | Cap Reduction From 75% Depop |
|---|---|---|---|---|---|
| 1 Segment | 240 | 200 | 180 | 16.7% | 25% |
| 2 Segments | 380 | 300 | 260 | 21% | 31.5% |
| 5 Segments | 800 | 600 | 500 | 25% | 37.5% |
| 10 Segments | 1500 | 1100 | 900 | 26.7% | 40% |
| 20 Segments | 2900 | 2100 | 1700 | 27.6% | 41.3% |
| 100 Segments | 14100 | 10100 | 8100 | 28.3% | 42.6% |

A further example relates to the case of a segment crossing multiple lines. The relationship takes the form:

$$C_{total} = (100 + 60 \text{ W}) + [80 \text{ W} \cdot (\text{depopulation factor})] \quad (6)$$

where W=the number of lines a segment crosses. The present embodiment, therefore, provides as much as a 25% reduction in net loading by depopulating segments from 4 to 8 logic modules long by 50%. We could achieve a 40% reduction in net load by depopulating segments 28 logic modules long by 75%.

Taking yet another example, if $C_{metal} = 0.3$ fF/μm,

Length=200 μm, $C_{antifuse} = 1$ fF/antifuse, $\text{Number}_{antifuse} = 16$ antifuses, and $C_{junction} = 100$ fF, then $$C_{total} = (other) + C_{antifuse} \quad (7)$$

$$C_{full} = (100 + 60 \text{ fF/logic module width}) + 16 \text{ fF} \quad (8)$$

$$C_{half} = (100 + 60 \text{ fF/logic module width}) + 8 \text{ fF} \quad (9)$$

$$C_{quarter} = (100 + 60 \text{ fF/logic module width}) + 2 \text{ fF} \quad (10)$$

Table 2 uses the equation (7) through (10) to derive sample capacitance values for tracks of varying lengths. This allows illustrating the impact of depopulation on capacitance.

TABLE 2

| Track Segment Length | $C_{Full}$ (fF) | $C_{Half}$ (fF) | $C_{Qtr}$ (fF) | C reduction from 50% depopulation |
|---|---|---|---|---|
| 1 | 176 | 168 | 164 | 4.7% |
| Segment 2 | 252 | 236 | 228 | 6.3% |
| Segments 8 | 708 | 644 | 612 | 9.0% |
| Segments 10 | 860 | 780 | 740 | 9.3% |
| Segments 20 | 1620 | 1460 | 1380 | 9.8% |

In general, with a segment crossing W lines:

$$C_{total} = (100 + 60 \text{ W}) + [16 \text{ W} \cdot (\text{depopulation factor})] \quad (11)$$

This example shows that if technology were able to produce antifuses with only 1 fF capacitance, it is doubtful that antifuse depopulation would improve performance. As this example shows, a 50% depopulation only results in a 5% to 10% net load reduction.

In determining the proper amount of depopulation, as well as the appropriate distinctions between those segments for which selective depopulation is helpful, certain antifuse defective materials are not ideal insulators (such as amorphous silicon, α-Si). Selective depopulation can be employed to reduce the leakage current without an unacceptable reduction in signal routability or programmability. If leakage current is 50 nA per antifuse at 5 volts and 125° C. and can be attributed entirely due to α-Si antifuses in defect-free CMOS, then the values of Table 3 can be calculated to study the impact of depopulation on leakage. In Table 3, the parameters NT means number of tracks, SL means segment length, NA means number of antifuses, and AL means antifuse leakage. With a segment crossing multiple tracks, W, the total capacitance equation takes the form:

$$C_{TOTAL} = (100 + 60 \text{ W}) + 16 \text{ W} (\text{depopulation factor}) \quad (12)$$

40 tracks×58 logic modules wide=2320 potential segments/channel. Using this scheme to depopulate the horizontal routing tracks, therefore, provides a 50% reduction in leakage. From this example of capacitance and leakage analysis, the preferred embodiment for this example technology is to depopulate 50% of a segment 5–9 logic modules wide and 75% of segment 10–20 logic modules wide. One could easily go through this analysis employing parameter characteristics of one's own technology to quickly derive an embodiment well suited for that technology.

TABLE 3

| Seg. LM Span | NT | SL | NA | AL @ 100% Pop'n | AL @ 75% Pop'n | AL @ 50% Pop'n | AL @ 25% Pop'n |
|---|---|---|---|---|---|---|---|
| 1 | 1 | 58 | 928 | 46 μA | 35 μA | 23 μA | 12 μA |
| 2–4 | 8 | 464 | 7424 | 371 μA | 278 μA | 186 | 93 μA |
| 5–9 | 17.2 | 998 | 15970 | 799 μA | 599 μA | 399 | 200 μA |
| 10–20 | 13.8 | 800 | 12800 | 640 μA | 480 μA | 320 | 160 μA |

Figure 2:
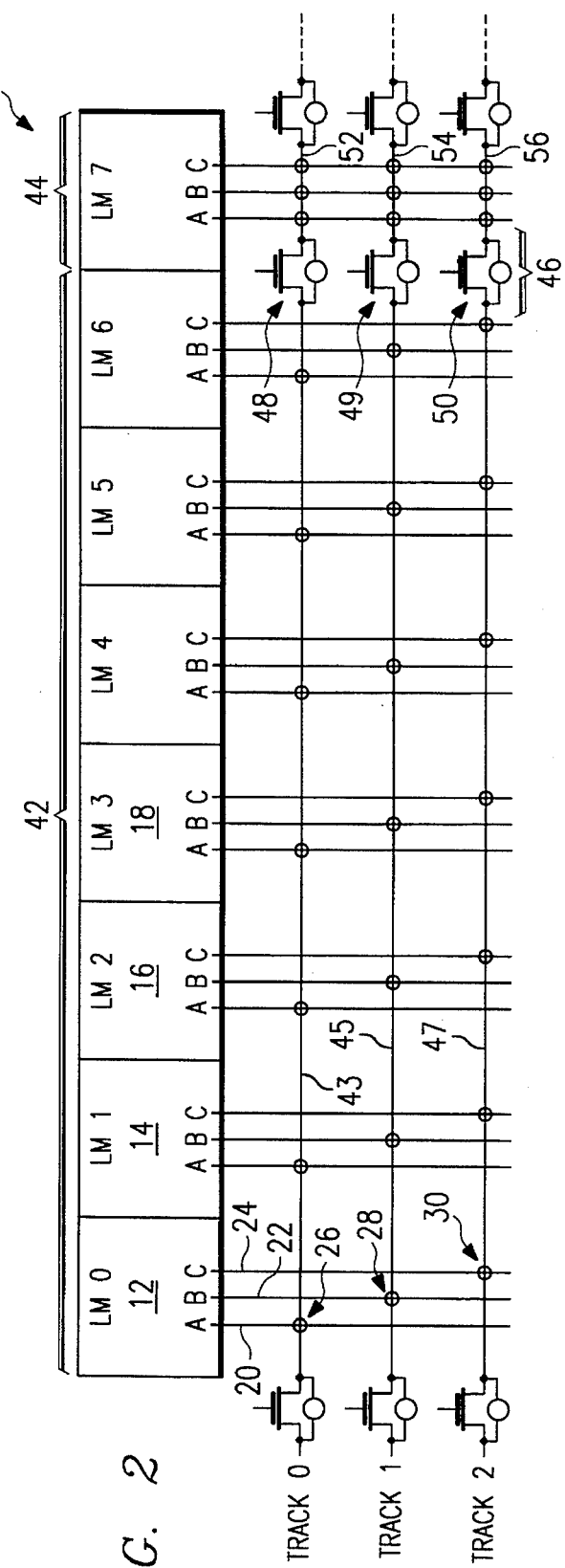
FIG. 2 illustrates association of a minimum-length, fully-populated segment that may be placed adjacent to a long, depopulated segment according to the present invention.

The present invention has application in a wide variety of configurations that embody numerous inventive concepts. FIG. 2, therefore, shows an alternative embodiment that adjoins a selectively depopulated long segment of an integrated circuit with a densely populated short segment through a set of segmentation transistors. Referring to selectively depopulated integrated circuit 40, there appears selectively depopulated long segments 42 that adjoins fully and densely populated segments 44 by way of segmentation transistors/antifuses 46. Selectively depopulated long segment 42 includes, for example, logic modules LM0 through LM6. For each logic module LM0 through LM6, three input pins A, B, and C lead to track 0, track 1, and track 2. For each of track 0 segment 43, track 1 segment 45, and track 2 segment 47, segmentation transistors 48, 49, and 50, respectively, connect to short segment tracks 52, 54, and 56. LM7 also has input pins A, B, and C that intersect track 0 at segment 52, track 1 at segment 54, and track 2 segment 56. As opposed to having sparsely populated antifuses, short segments 44 includes an antifuse at each of the input pins A, B, and C for each of the short segments 52, 54, and 56. The result is a total of nine antifuses for the short segments.

An attractive feature of segmentation fuses 46, however, is that only if it is necessary to adjoin a short segment 44 to a long segment 42 does the densely populated segment 44 connect to a sparsely populated long segment 42. As a result, track 0, for example, may jumper to track 0 segment 52 by programming the segmentation antifuse which is electrically parallel to transistor 48. Alternatively, segmentation transistor 49 may maintain an open between track 1 segment 45 and segment 54 so that the higher per-unit-length leakage current and capacitance of the dense antifuse portion of segment 54 does not affect the operation of long segment 42.

Figure 3:
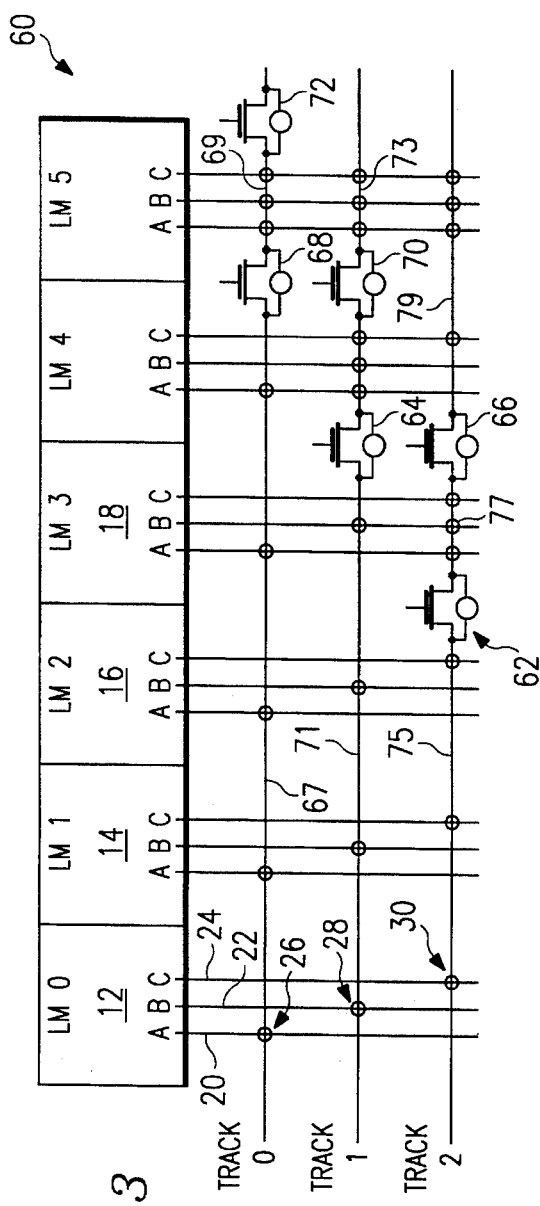
FIG. 3 shows the spatial distribution of segmentation points of similar track segments formed consistently with concepts of the present invention.

FIG. 3 illustrates a further embodiment of the present invention that includes spatially distributed or staggered segmentation points of similar track segments. This type of staggering improves routability in the user-programmable integrated circuit 60. Thus, the staggered user-programmable integrated circuit 60 includes logic modules LM0 through LM5, each having associated input pins A, B, and C. Within user-programmable integrated circuit 60 are segmentation transistors such as transistors 62, 64, 66, 68, 70 and 72. The segmentation transistors may be placed at other points within user-programmable integrated circuit 60. Thus, instead of the alignment of the segmentation transistors that appears in FIG. 2, the segmentation transistors of FIG. 23 are at different points along the various tracks. The result is an improvement in the general routability of user-programmable integrated circuit 60 or the similar user programmable integrated circuit 10 of FIG. 1.

Figure 4:
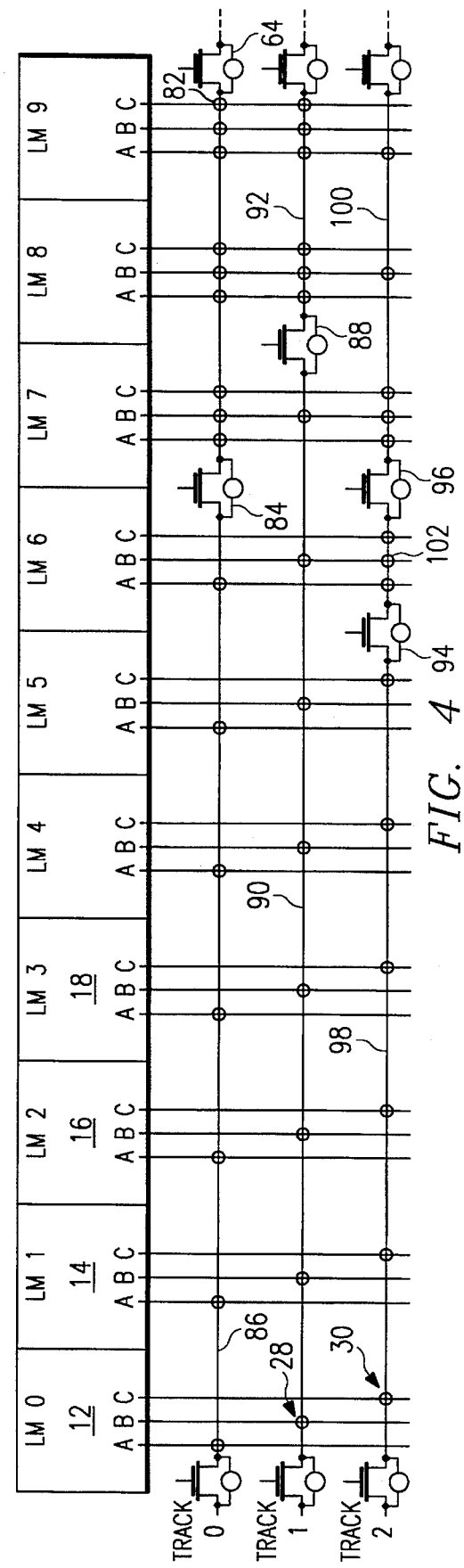
FIG. 4 depicts segments of various lengths formed according to the present invention.

FIG. 4 shows another example of long segments that have different lengths. The circuit diagrams of FIGS. 1 through 7 show very simple three-input logic modules to illustrate this invention. One should note that typical logic modules may have six to ten inputs or more in antifuse-based FPGA architectures. Thus, in practical cases, the sparsely-populated segments may have more than one potential populated input antifuse location. In such a case, circuitry architects may apply information from the macro library and the associated statistics of macro utilization to determine which logic module inputs to most frequently populate or, conversely, which logic module inputs to depopulate more frequently. At the same time, designers should consider minimizing the reductions in routability due to depopulation.

User-programmable integrated circuit 80 of FIG. 4 illustrates dense segments of various lengths. Thus, dense segment 82 appears on track 0 and through segmentation transistor 84 joins track 0 portion 86. Similarly, segmentation transistor 88 separates track 1 portion 90 from the short dense segment 92. Note that sparsely populated segment 86 of track 0 and sparsely populated segment 90 of track 1 have different lengths. The same is true of densely populated segment 82 and densely populated segment 92. In a similar fashion, segmentation transistors 94 and 96 separate track 2 into three segments. Two segments are sparsely populated, i.e., segments 98 and 100, while short, densely populated segment 102 is isolated by segmentation transistors 94 and 96.

FIG. 5 shows user-programmable integrated circuit 10 which is similar to that of FIG. 4 and illustrates the desirability of distributing the logic module inputs that are to be populated on sparsely populated segments. Thus, segmentation transistor 114 separates sparsely populated segment 112 from densely populated segment 116. Likewise, segmentation transistors 122 and 124, respectively, separate sparsely populated segments 118 and 120 from short, densely populated segment 126. Also, segmentation transistors 128 and 130 separate, respectively, selectively depopulated segments 132 and 134 from densely populated short segment 136.

User-programmable integrated circuit 110, therefore, achieves a desired effect of providing a sparse segment to access two different functional inputs. This may be important for architectures that use logic modules (such as multiplexer-based logic modules) which have asymmetric input functionality. For example, if the logic modules were to perform a two-input NAND gate, the inputs may be required at input pins B and C of the logic module such that input pins A and C may not achieve the desired result. Shifting populated inputs around on a segment allows the placement tool to shift the macro instance into routable positions.

In FIG. 6 appears yet a further embodiment of user-programmable integrated circuit 140 that includes segmentation transistors 142 on track 0, segmentation transistor 144, and segmentation transistor 146 on track 2. The embodiment of FIG. 6 illustrates the concept of variable depopulation within an individual segment. One of the concepts that user-programmable integrated circuit 140 of FIG. 6 embodies is that of increasing routability while still achieving significant reduction in the number of antifuses and their associated parasitic leakage current and capacitance characteristics. User-programmable integrated circuit 140 allows a segment to traverse a significant distance between a driving node such as LM0 and a destination point such as LM8 or LM9 as they connect with track 0, for example.

As track 0 of user-programmable integrated circuit 140 illustrates, between LM0 or LM1 and LM8 or LM9, the signal may be required very infrequently. As such, this distance is selectively depopulated. Increasing the density of the antifuse population near the ends of the segment, the probability is increased that the segment's signal will be available to the required logic module input. This also may reduce the frequency of requiring a short, dense segment being connected to the long, sparse segment.

Figure 7:
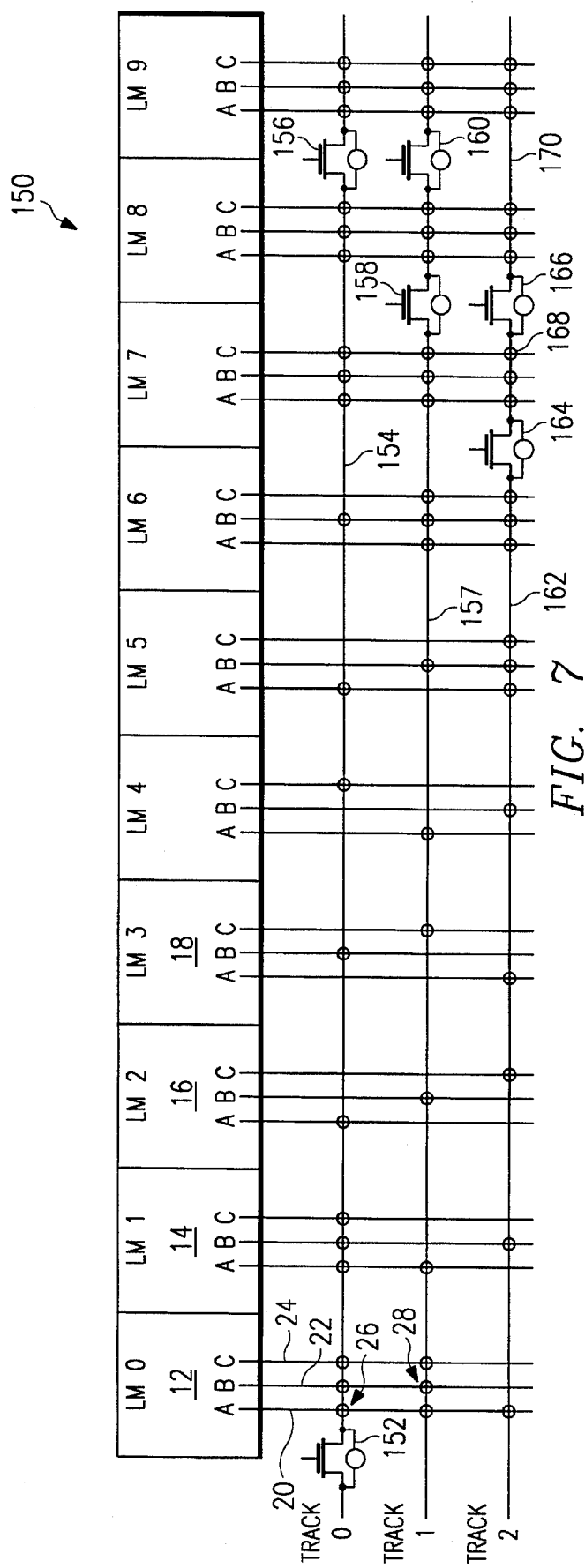
FIG. 7 shows combining variably depopulated long sparse segments that have density populated segments ends with adjoining short densely populated segments.

In FIG. 7, the combination of several inventive concepts of the present invention appear. For example, FIG. 7 includes a long track 0 segmentation transistor 152 that connects to densely populated portions of long segment 154. These densely populated portions go to LM0 and LM1. Another densely populated portion of long segment 154 appears at LM7 and LMS. Separating LM8 from LM9, which is also densely populated is segmentation transistor 156. On track 1 appears densely populated segment LM0 that is sparsely populated until the densely populated portion associated with LM6 and LM7. Segmentation transistor 158 separates LM7 and LM8 connections along track 1, while segmentation transistor 160 separates LM8 and LM9 antifuses along track 1. On track 2, sparsely populated portions of long segment 162 continue until it reaches that portion of long segments 162 associated with LM5 and LM6. Segmentation transistor 164 separates LM6 and LM7, while segmentation transistor 166 separates short segment 168 from densely populated segment 170.

User-programmable integrated circuit 150 of FIG. 7, therefore, illustrates the combination of including a variably depopulated long sparse segment having densely populated portions or segments ends together with an adjoining short, densely populated segments. As in the case of user-programmable integrated circuit 80 of FIG. 4, the short, densely populated segments of user-programmable integrated circuit 150 of FIG. 7 may be of variable length.

Figure 8:
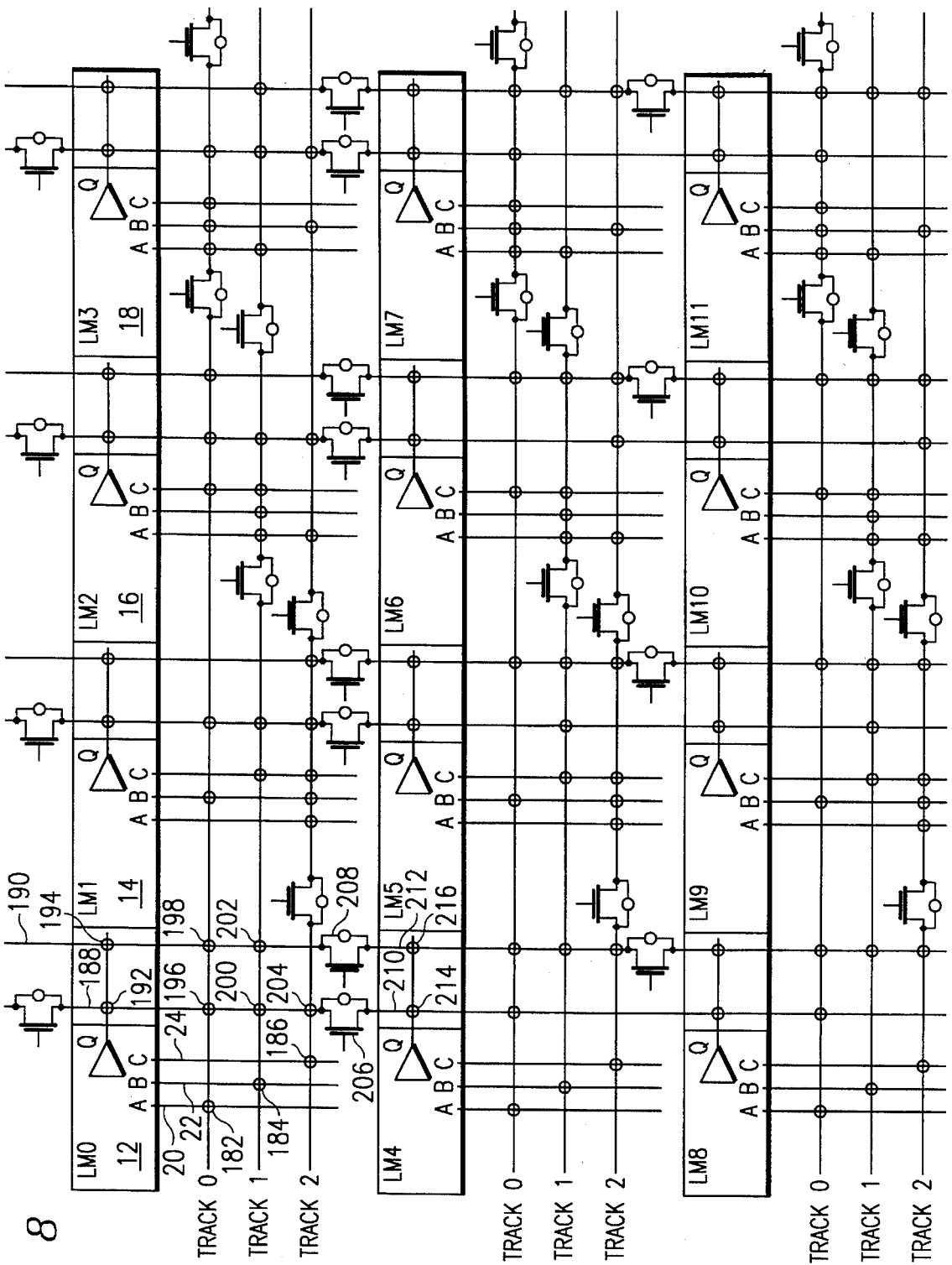
FIG. 8 demonstrates application of the present inventive concepts to both the X and Y dimensions of a routing architecture.

FIG. 8 shows yet a further embodiment of the present invention in the form of user-programmable integrated circuit 180 that shows how inventive concepts of the various embodiments may be employed in both X and Y dimensions of a routing architecture. For example, in user-programmable integrated circuit 180, LM0 has input pins A, B, and C that, respectively, have antifuse links 182, 184, and 186 that associate, again respectively, with track 0, track 1 and track 2. These are the above-described connections that appear in the y direction. Also, however, output pin Q may exit LM0 to intersect vertical tracks 188 and 190 and antifuses 192 and 194, respectively. Vertical tracks 188 and 190 may also intersect at antifuses 196 and 198 with track 0, and antifuses 200 and 202 with track 1 and, for example at antifuse 204 with track 2. Moreover, segmentation transistors 206 and 208 may, for example, isolate vertical tracks 188 and 190 from vertical track portions 210 and 212 that may connect to output pin Q of LM4 via antifuse links 214 and 216.

User-programmable integrated circuit 180, therefore, attempts to illustrate that the ideas of the various embodiments may be employed in both the x and y dimensions of a routing architecture. The simple case of user-programmable integrated circuit 180 shows the long sparse segments as only two logic module rows. The densely populated short segments are a single row tall. In practical cases, the vertical segment lengths would be longer and may vary. The inventive concepts of the embodiments of FIGS. 1 through 7, above, therefore, may be applied to the vertical routing resources. Furthermore, although the output shown in FIG. 8 is shown as fusible to the two vertical segments in each column, the output could be hard connected to either vertical or horizontal segments while still being fusible to additional segments running in the same direction or onto external segments adjoining the output segments.

A technical advantage of the present invention is that it provides a way of differentiating between connectors in an integrated electronic circuit for which leakage and capacitance from antifuses contribute more than a desirable amount to the total leakage and capacitance of the connectors.

Another technical advantage of the present invention is that it may be used for a variety of programmable logic devices including, for example, a field programmable gate array (FPGA) to optimize the FPGA's programmability while minimizing the undesirable effects of leakage and capacitance associated with the antifuses that connect the FPGA logic modules to various tracks.

Another technical advantage of the present invention is that it permits selecting particular antifuses to depopulate from a candidate routing architecture according to the potential macros that may be used to program the integrated electronic circuit.

One aspect of the invention is an integrated electronic circuit architecture that has low leakage current and capacitance and that includes a user-programmable integrated circuit design having a plurality of designed conductors and a plurality of designed functional circuit blocks. In the architecture, a plurality of user-programmable antifuse elements connect to the plurality of conductors and the plurality of functional circuit blocks. The plurality of user-programmable antifuses connect the plurality of conductors with one another and to the plurality of functional circuit blocks. The plurality of conductors is segregated into at least two groups including a first group of conductors and a second group of conductors. The first group of conductors has a greater length than the second group of conductors and conductors of the first group connect to conductors in the second group of conductors. Antifuses in the first group of conductors are selectively depopulated to reduce capacitance and leakage associated with their placement in the user-programmable integrated circuit, while the conductors of the first group of conductors permit access to conductors in the second group of conductors.

Although the invention has been described with reference to the above-specified embodiments, this description is not meant to be construed in a limiting sense. Various modifications of the disclosed embodiment, as well as alternative embodiments of the invention will become apparent to persons skilled in the art upon reference to the above description. It is, therefore, contemplated that the appended claims will cover such modifications that fall within the true scope of the invention.

What is claimed is:

1. An integrated electronic circuit architecture having low leakage current and capacitance comprising, in combination:

a plurality of functional circuit blocks each with at least one connection lead;

a plurality of conductors disposed generally orthogonally to and crossing said connection leads;

said plurality of conductors comprising a first group of conductors and a second group of conductors, the conductors in said first group of conductors having greater length than the conductors in said second group;

a plurality of segmentation fusible devices each disposed between one conductor in said first group of conductors and one said conductor in said second group of conductors thereby forming a plurality of conductors with at least one conductor in said first group of conductors coupled to at least one conductor in said second group of conductors;

a first plurality of user-programmable antifuse elements disposed along each of the conductors in said first group of conductors at the crossing point of some but not all of said connection leads crossing said first group of conductors for selectively providing a connection between a conductor in said first group of conductors and the connection lead crossing at the position of a blown antifuse element; and a second plurality of user-programmable antifuse elements disposed along each of the conductors in said second group of conductors at the crossing point of all of said connection leads crossing said second group of conductors for selectively providing a connection between each said connection lead crossing each conductor in said second group of conductors at the position of a blown antifuse element.

2. The architecture of claim 1 wherein at least one conductor in said second group of conductors is disposed parallel to and immediately adjacent at least one conductor in said first group of conductors.

3. The architecture of claim 1 wherein said functional circuit blocks each comprise a programmable logic device.

4. The architecture of claim 1, wherein said antifuses associated with said first group of conductors are positioned according to a macro library associated with said user-programmable integrated circuit design.

5. A method for reducing leakage current and capacitance in a user-programmable integrated circuit comprising:

provinding a plurality of circuit blocks with at least one connection lead;

providing a plurality of conductors disposed generally orthogonally to and crossing said connection leads, said conductors being divided into a first and a second group of conductors where the conductors in said first group are longer than the conductors in said second group;

providing a plurality of segmentation fusible devices, each said fusible device being disposed between one conductor in said first group of conductors and one conductor in said second group of conductors thereby forming a plurality of conductors with at least one conductor in said first group of conductors coupled to at least one conductor in said second group of conductors;

locating a first plurality of antifuse elements along the length of each said conductor in said first group of conductors at locations of the crossover with some but not all said connection leads for selectively providing a connection between said conductor in said first group and the connection lead adjacent thereto; and locating a second plurality of antifuse elements along the length of each said conductor in said second group of conductors at locations of the crossover with all said connection leads for selectively providing a connection between said conductor in said second group and the connection lead adjacent thereto.

6. The method of claim 5 wherein at least some of the conductors in said second group of conductors are positioned in parallel relation and adjacent to at least some of the conductors in said first group of conductors.

7. The method of claim 5 additionally including the step of:

shorting at least some of said antifuses to form a connection between conductors in said first group of conductors and at least one said connection lead.

8. The method of claim 5 additionally including the step of:

shorting at least some of said antifuses to form a connection between conductors in said second group of conductors and at least one said connection lead.

9. The method of claim 5 additionally including the step of:

altering the state of at least one segmentation fusible device to disconnect the conductor in said first group from the conductor in said second group which are coupled to the blown segmentation fusible device.

* * * * *